United States Patent
Kim

(10) Patent No.: US 11,244,787 B2
(45) Date of Patent: Feb. 8, 2022

(54) SEMICONDUCTOR DEVICE AND METHOD FOR FABRICATING THE SAME

(71) Applicant: SK hynix Inc., Gyeonggi-do (KR)

(72) Inventor: Seung-Muk Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 70 days.

(21) Appl. No.: 16/677,928

(22) Filed: Nov. 8, 2019

(65) Prior Publication Data

US 2020/0312552 A1 Oct. 1, 2020

(30) Foreign Application Priority Data

Mar. 29, 2019 (KR) .......................... 10-2019-0037085

(51) Int. Cl.
*H01G 4/10* (2006.01)
*H01G 4/008* (2006.01)
*H01G 4/14* (2006.01)

(52) U.S. Cl.
CPC ............... *H01G 4/10* (2013.01); *H01G 4/008* (2013.01); *H01G 4/14* (2013.01)

(58) Field of Classification Search
CPC ............. H01G 4/10; H01G 4/008; H01G 4/14
See application file for complete search history.

(56) References Cited

U.S. PATENT DOCUMENTS

| | | | |
|---|---|---|---|
| 6,140,671 A * | 10/2000 | Lee | H01L 27/10852 257/295 |
| 8,546,232 B2 | 10/2013 | Sako | |
| 8,710,624 B2 | 4/2014 | Tonari | |
| 2006/0097299 A1* | 5/2006 | Ahn | H01L 21/02181 257/295 |
| 2016/0104763 A1* | 4/2016 | Choi | H01L 28/90 257/532 |
| 2018/0175042 A1* | 6/2018 | Jang | H01L 27/10876 |
| 2020/0235111 A1* | 7/2020 | Calderoni | H01L 28/55 |
| 2020/0395438 A1* | 12/2020 | Kang | H01L 28/91 |

* cited by examiner

*Primary Examiner* — Eugene Lee
(74) *Attorney, Agent, or Firm* — IP & T Group LLP

(57) ABSTRACT

A capacitor includes: a plurality of bottom electrodes; a dielectric layer formed over the bottom electrodes; and a top electrode formed over the dielectric layer, wherein the top electrode includes a carbon-containing material and a germanium-containing material that fill a gap between the bottom electrodes.

13 Claims, 9 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2019-0037085, filed on Mar. 29, 2019, with the Intellectual Property Office of Korea, and which is incorporated herein by reference in its entirety.

BACKGROUND

1. Field

Various embodiments of the present invention relate generally to a semiconductor device, and, more particularly, to a semiconductor device including a capacitor and a method for fabricating the semiconductor device.

2. Description of the Related Art

For manufacturing highly integrated semiconductor devices capacitors with sufficient capacitance within a limited area are required. Capacitance of a capacitor is proportional to the surface area of an electrode and the dielectric constant of a dielectric material, and is inversely proportional to the thickness of an equivalent oxide layer of the dielectric material. Methods for increasing the capacitance of a capacitor within a limited area may involve increasing the surface area of an electrode by forming a capacitor of a three-dimensional structure, reducing the thickness of an equivalent oxide layer of the dielectric material, or using a high-k material.

SUMMARY

Embodiments of the present invention are directed to an improved capacitor for a semiconductor device and a method for fabricating the capacitor and a semiconductor device including the capacitor. The capacitor may exhibit improved reliability.

In accordance with an embodiment of the present invention, a capacitor includes: a plurality of bottom electrodes; a dielectric layer formed over the bottom electrodes; and a top electrode formed over the dielectric layer, wherein the top electrode includes a carbon-containing material and a germanium-containing material that fill a gap between the bottom electrodes.

In accordance with another embodiment of the present invention, a method for forming a capacitor includes: forming a plurality of bottom electrodes; forming a dielectric layer formed over the bottom electrodes; and forming a top electrode that includes a carbon-containing material and a germanium-containing material that fill a gap between the bottom electrodes over the dielectric layer.

These and other features and advantages of the present invention will become better understood by the following detailed description of embodiments in conjunction with the accompanying drawings.

DETAILED DESCRIPTION

Figure 1:
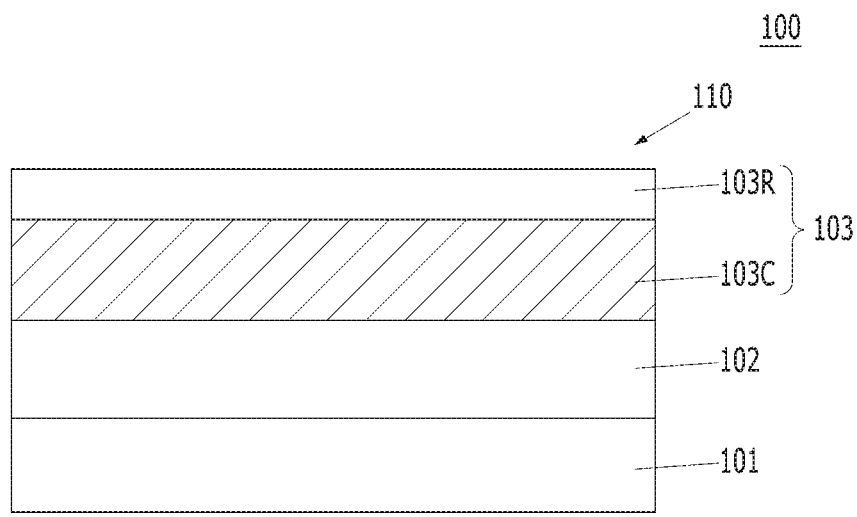
FIG. 1 is a cross-sectional view illustrating a semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. It is noted that reference to "an embodiment," "another embodiment" or the like does not necessarily mean only one embodiment, and different references to any such phrase are not necessarily to the same embodiment(s).

The drawings are not necessarily to scale and, in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless stated or the context indicates otherwise.

As used herein, singular forms may include the plural forms as well and vice versa, unless the context dearly indicates otherwise. The articles 'a' and 'an' as used in this application and the appended claims should generally be construed to mean 'one or more' unless specified otherwise or clear from context to be directed to a singular form.

In the following embodiments, a top electrode of a capacitor may include at least a carbon-containing material in order to enhance the resistance to bending of a bottom electrode of the capacitor. Examples of carbon-containing materials may include silicon carbide (SiC), and silicon-carbon-germanium alloy (Si—C—Ge).

The top electrode may be a single-layer structure, a double-layer structure, a triple-layer structure, or a multi-layer structure with at least one of the layers being made of a carbon-containing material. For example, the top electrode may be a single-layer structure of silicon carbide layer (SiC) or a double-layer structure of a silicon carbide layer and a silicon germanium layer (SiC/SiGe) with the silicon germanium layer on top of the silicon carbide layer. Also, the top electrode may be formed of a single-layer structure of a Si—C—Ge ahoy. Also, the top electrode may be a double-layer structure of a Si—C—Ge alloy layer and a silicon germanium layer (Si—C—Ge/SiGe) with the silicon germanium layer on top of the Si—C—Ge alloy layer.

It has been found that forming the top electrode to include a carbon-containing material as described above, allows a narrow gap between the bottom electrodes to be filled without voids. Therefore, bending of the bottom electrode may be reduced, and the characteristics and yield of capacitors may be improved.

FIG. 1 is a cross-sectional view illustrating a semiconductor device 100 in accordance with an embodiment of the present invention.

Referring to FIG. 1, the semiconductor device 100 may be or include a capacitor 110. The capacitor 110 may include a bottom electrode 101, a dielectric layer 102, and a top electrode 103.

The bottom electrode 101 may be made or include a metal, a metal-containing material, a semiconductor material or any combination thereof. According to an embodiment, the bottom electrode 101 may include a metal such as titanium, tungsten, ruthenium, iridium or any combination thereof. According to another embodiment the bottom electrode 101 may include a metal-containing material such as a metal nitride, a conductive metal oxide or any combination thereof. Examples of metal-containing materials for the bottom electrode 101 include titanium nitride (TiN), tantalum nitride (TaN), tungsten nitride (WN), ruthenium oxide, iridium oxide, or any combination thereof. According to another embodiment of the present invention, the bottom electrode 101 may include a silicon or a silicon-containing material. The bottom electrode 101 may have a single-layer structure, or a multi-layer structure. In an embodiment, the bottom electrode 101 may include a silicon layer, a silicon germanium layer, or any combination thereof.

The dielectric layer 102 may have a single-layer structure, or a multi-layer structure. The multi-layer structure may be a laminate structure. The dielectric layer 102 may contact the bottom electrode 101. The dielectric layer 102 may be made or include a high-k material. The high-k material of the dielectric layer 102 may have a higher dielectric constant than silicon oxide ($SiO_2$). More specifically, the silicon oxide has a dielectric constant of approximately 3.9, while the high-k material of the dielectric layer 102 may be a material having a dielectric constant of approximately 4.0 or higher. For example, the high-k material of the dielectric layer 102 may have a dielectric constant of approximately 20.0 or more. Examples of suitable high-k materials for the dielectric layer 102 may include hafnium oxide ($HfO_2$), zirconium oxide ($ZrO_2$), aluminum oxide ($Al_2O_3$), titanium oxide ($TiO_2$), tantalum oxide ($Ta_2O_5$), niobium oxide ($Nb_2O_5$), or strontium titanium oxide ($SrTiO_3$). The dielectric layer 102 may have a single-layer structure including a single layer of one of the aforementioned high-k materials or a multi-layer structure including two or more layers of at least two of the aforementioned high-k materials. In an embodiment, the dielectric layer 102 may be formed of a zirconium-based oxide (Zr-based oxide). The dielectric layer 102 may be a multi-layer structure including one or more layers of zirconium oxide ($ZrO_2$). The dielectric layer 102 may be a multi-layer structure including two layers of zirconium oxide ($ZrO_2$) separated by a layer of another high-k material. In an embodiment, the dielectric layer 102 may include a triple-layer structure of $ZrO_2$, $Al_2O_3$ and $ZrO_2$ sequentially stacked on top of the bottom electrode 101 in the recited order (may also be referred to as the ZAZ structure). The ZAZ structure may be a structure in which zirconium oxide, aluminum oxide, and zirconium oxide are sequentially laminated. The ZAZ structure may also be referred to as a zirconium oxide-based layer. According to another embodiment of the present invention, the dielectric layer 102 may be formed of a hafnium-based oxide (Hf-based oxide). The dielectric layer 102 may be a multi-layer structure including hafnium oxide. For example, the dielectric layer 102 may include a HAH structure including $HfO_2$, $Al_2O_3$, and $HfO_2$. The HAH structure may be a structure in which hafnium oxide, aluminum oxide, and hafnium oxide are sequentially laminated. The HAH structure may be referred to as a hafnium oxide-based layer ($HfO_2$-based layer).

The aluminum oxide ($Al_2O_3$) in ZAZ ($ZrO_2/Al_2O_3/ZrO_2$) and HAH ($HfO_2/Al_2O_3/HfO_2$) has a greater band gap than zirconium oxide ($ZrO_2$) and hafnium oxide ($HfO_2$). Aluminum oxide ($Al_2O_3$) has a lower dielectric constant than zirconium oxide ($ZrO_2$) and hafnium oxide ($HfO_2$). Thus, the dielectric layer 102 may include a stack of a high-k material and a high band gap material having a higher band gap than the high-k material. As will be described below, the dielectric layer 102 may include silicon oxide ($SiO_2$) as a high band gap material other than aluminum oxide. The dielectric layer 102 may suppress leakage by including a high band gap material.

According to another embodiment of the present invention, the dielectric layer 102 may include a laminate such as ZAZA ($ZrO_2/Al_2O_3/ZrO_2/Al_2O_3$) or HAHA ($HfO_2/Al_2O_3/HfO_2/Al_2O_3$).

According to another embodiment of the present invention, an interface control layer (not shown) may be formed between the dielectric layer 102 and the top electrode 103. An interface control layer (not shown) may also be formed between the bottom electrode 101 and the dielectric layer 102. For example, the interface control layer or layers may be formed of or include titanium oxide ($TiO_2$) or tantalum oxide ($Ta_2O_5$).

The top electrode 103 may include a carbon-containing material. The top electrode 103 may include a first top electrode 103C and a second top electrode 103R. The first top electrode 103C may contact the dielectric layer 102 directly. The first top electrode 103C and the second top electrode 103R may be formed of different materials. At least one of the first top electrode 103C and the second top electrode 103R may be formed of a carbon-containing material. The first top electrode 103C may be made of a carbon-containing material, and the second top electrode 103R may be made of a metal or metal-containing material.

The first top electrode 103C may include carbon and a silicon-containing material. The first top electrode 103C may be made of a silicon carbide. The second top electrode 103R may include a metal, a metal nitride, a conductive metal nitride, or any combination thereof. The second top electrode 103R may include titanium (Ti), titanium nitride (TIN), tantalum nitride (TaN), tungsten (W), tungsten nitride (WN), ruthenium, iridium, ruthenium oxide, iridium oxide, or any combination thereof. The second top electrode 103R may lower the resistance of the top electrode 103. In an embodiment, the second top electrode 103R may have a smaller thickness than the first top electrode 103C. The bottom electrode 101 may have a smaller thickness than the top electrode 103. The dielectric layer 102 may have a smaller thickness than the top electrode 103. The thickness of the dielectric layer 102 may be the same or different with the thickness of the bottom electrode 101.

Figure 2:
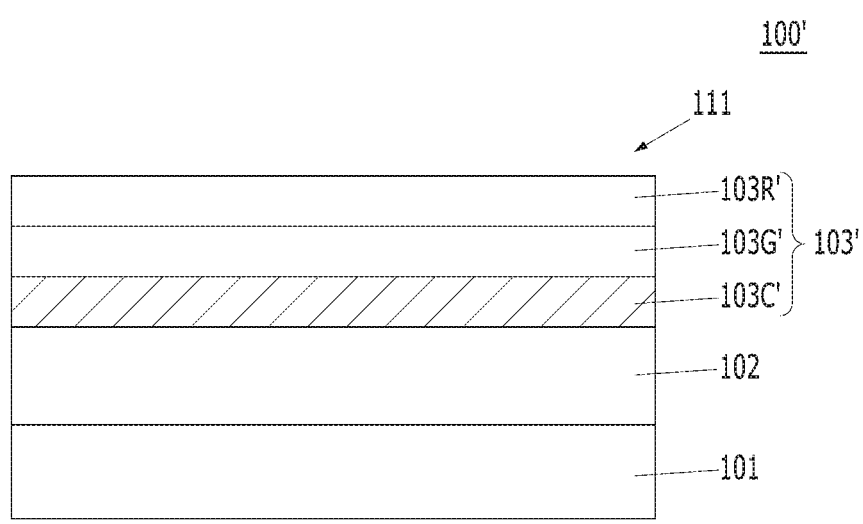
FIG. 2 is a cross-sectional view illustrating a semiconductor device in accordance with another embodiment of the present invention.

FIG. 2 is a cross-sectional view illustrating a semiconductor device 100' in accordance with another embodiment of the present invention.

Referring to FIG. 2, the semiconductor device 100' may include a capacitor 111. The capacitor 111 may include a bottom electrode 101, a dielectric layer 102, and a top electrode 103'. The bottom electrode 101 and the dielectric layer 102 may be the same as in the capacitor 110 shown in FIG. 1.

The top electrode 103' of the capacitor 111 may include a first top electrode 103C', a second top electrode 103G', and a third top electrode 103R'. The first top electrode 103C' may contact the dielectric layer 102 directly. The first top electrode 103C', the second top electrode 103G', and the third top electrode 103R' may be formed of different materials.

The first top electrode 103C' may be made of a carbon-containing material, and the second top electrode 103G' may be a germanium-containing material, and the third top electrode 103R' may be a metal or metal-containing material. The first top electrode 103C' may include carbon and a silicon-containing material. The first top electrode 103C' may be made of silicon carbide (SIC), and the second top electrode 103G' may be made of silicon germanium (Site), and the third top electrode 103R' may be made of a metal, a metal nitride, a conductive metal nitride, or any combination thereof. The third top electrode 103R' may include titanium (Ti), titanium nitride (TIN), tantalum nitride (TaN), tungsten (W), tungsten nitride (WN), ruthenium, iridium, ruthenium oxide, iridium oxide, or any combination thereof. The third top electrode 103R' may lower the resistance of the top electrode 103.

Figure 3A:
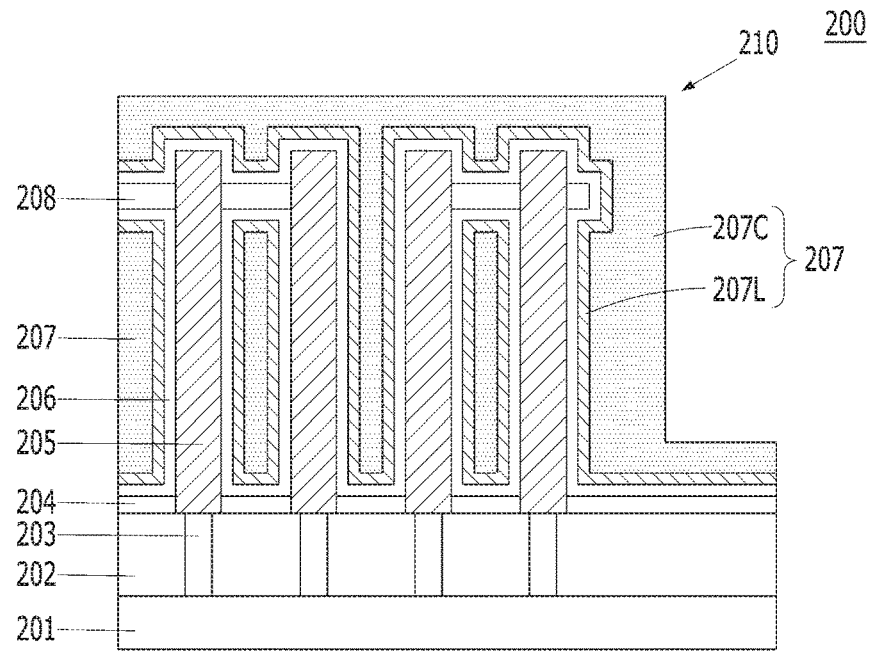
FIGS. 3A to 3C are cross-sectional views illustrating a semiconductor device in accordance with another embodiment of the present invention.
Figure 3B:
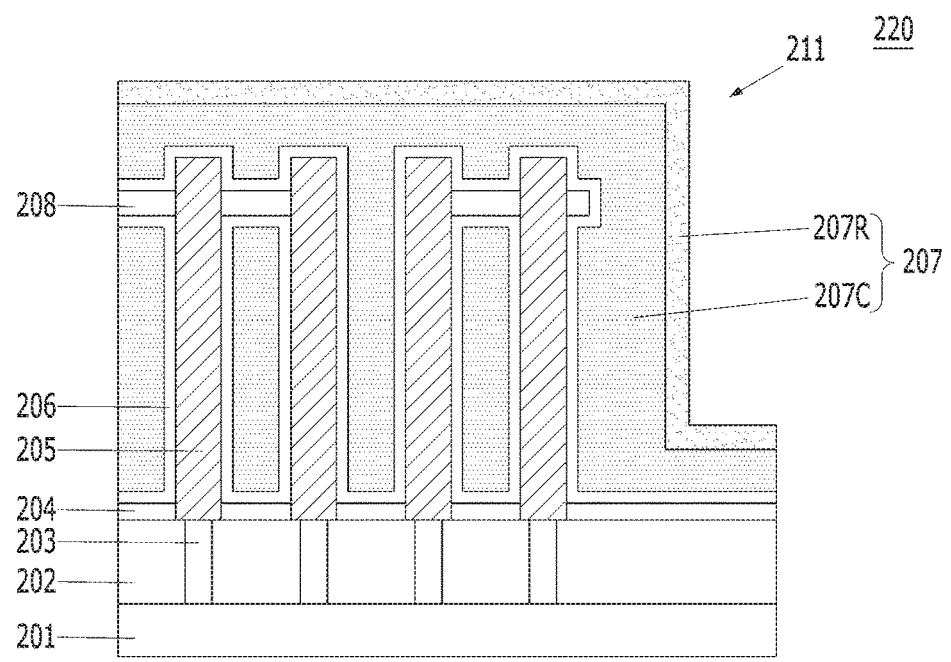
Figure 3C:
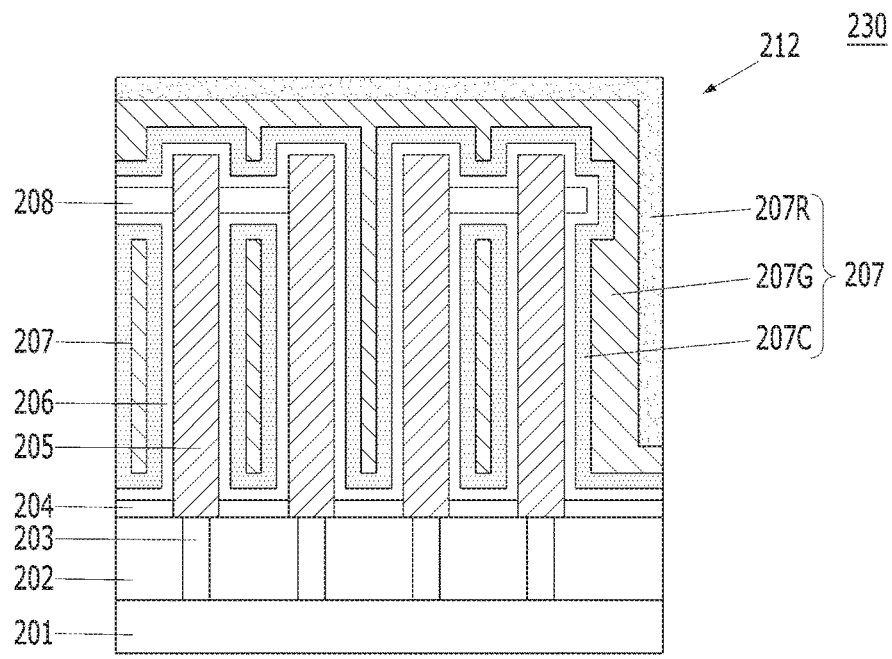

FIGS. 3A to 3C are cross-sectional views illustrating a semiconductor device 200 in accordance with another embodiment of the present invention.

Referring to FIG. 3A, the semiconductor device 200 may include a semiconductor substrate 201, a plurality of storage node contact plugs 203 spaced apart from one another over the semiconductor substrate 201, and a capacitor structure 210 over the storage node contact plugs 203. The storage node contact plugs 203 may penetrate through an inter-layer dielectric layer 202 formed over the semiconductor substrate 201. An etch stop layer 204 may further be formed over the storage node contact plugs 203 and the inter-layer dielectric layer 202. The capacitor structure 210 may include a plurality of bottom electrodes 205, a dielectric layer 206, and a top electrode 207. The bottom electrodes 205 may be spaced apart from one another and may each electrically contact one of the storage node contact plugs 203 by penetrating through the etch stop layer 204. The plurality of bottom electrodes 205 may be supported by a supporter 208. For example, as illustrated two or more bottom electrodes 205 may be supported by a supporter 208. According to another embodiment of the present invention, the supporter 208 may include multi-level supporters. The multi-level supporters may include a first supporter for supporting a middle portion of the bottom electrode 205 and a second supporter for supporting an upper portion of the bottom electrode 205.

The bottom electrodes 205 may include a metal, or a metal-containing material. The bottom electrodes 205 may include a metal, a metal nitride, a conductive metal oxide, or any combination thereof. The bottom electrodes 205 may include titanium (Ti), titanium nitride (TiN), tantalum nitride (TaN), tungsten (W), tungsten nitride (WN), ruthenium, iridium, ruthenium oxide, iridium oxide, or any combination thereof. According to another embodiment of the present invention, the bottom electrodes 205 may include a silicon-containing material. The bottom electrodes 205 may include a silicon layer, a silicon germanium layer, or any combination thereof. The bottom electrodes 205 may have a pillar shape.

The dielectric layer 206 may have a single-layer structure, or a multi-layer structure. The multi-layer structure may be a laminate structure. The dielectric layer 206 may surround each of the bottom electrodes 205. The dielectric layer 206 may directly contact each of the bottom electrodes 205.

The dielectric layer 206 may be made or include a high-k material. The high-k material of the dielectric layer 206 may have a higher dielectric constant than silicon oxide ($SiO_2$), More specifically, the silicon oxide has a dielectric constant of approximately 19, while the high-k material of the dielectric layer 206 may be a material having a dielectric constant of approximately 4.0 or higher. In an embodiment, the high-k material of the dielectric layer 206 may have a dielectric constant of approximately 20.0 or more. Examples of suitable high-k materials for the dielectric layer 206 may include hafnium oxide ($HfO_2$), zirconium oxide ($ZrO_2$), aluminum oxide ($Al_2O_3$), titanium oxide ($TiO_2$), tantalum oxide ($Ta_2O_5$), niobium oxide ($Nb_2O_5$), or strontium titanium oxide ($SrTiO_3$). The dielectric layer 206 may have a single-layer structure including a single layer of one of the aforementioned high-k materials or a multi-layer structure including two or more layers of at least two of the aforementioned high-k materials. In an embodiment, the dielectric layer 206 may be formed of a zirconium-based oxide (Zr-based oxide). The dielectric layer 206 may be a multi-layer structure including one or more layers of zirconium oxide ($ZrO_2$). The dielectric layer 206 may be a multi-layer structure including two layers of zirconium oxide ($ZrO_2$) separated by a layer of another high-k material. In embodiment, the dielectric layer 206 may include a triple-layer structure of $ZrO_2$, $Al_2O_3$ and $ZrO_2$ sequentially stacked on top of the bottom electrodes 205 in the recited order. The ZAZ structure may be a structure in which zirconium oxide, aluminum oxide, and zirconium oxide are sequentially laminated. The ZAZ structure may also be referred to as a zirconium oxide-based layer. According to another embodiment of the present invention, the dielectric layer 206 may be formed of a hafnium-based oxide (Hf-based oxide). The dielectric layer 206 may be a multi-layer structure including hafnium oxide. For example, the dielectric layer 206 may include a HAH structure including $HfO_2$, $Al_2O_3$, and $HfO_2$. The HAH structure may be a structure in which hafnium oxide, aluminum oxide, and hafnium oxide are sequentially laminated. The HAH structure may be referred to as a hafnium oxide-based layer ($HfO_2$-based layer).

Aluminum oxide ($Al_2O_3$) in ZAZ ($ZrO_2$/$Al_2O_3$/$ZrO_2$) and HAH ($HfO_2$/$Al_2O_3$/$HfO_2$) may have a greater band gap than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Thus, the dielectric layer 206 may include a stack of a high-k material and a high band gap material having a greater band gap than the high-k material. As will be described below, the dielectric layer 206 may also include silicon oxide ($SiO_2$) as a high band gap material other than aluminum oxide. The dielectric layer 206 may suppress leakage by including a high band gap material.

According to another embodiment of the present invention, the dielectric layer 206 may include a laminate, such as ZAZA ($ZrO_2/Al_2O_3/ZrO_2/Al_2O_3$) or HAHA ($HfO_2/Al_2O_3/HfO_2/Al_2O_3$).

According to another embodiment of the present invention, an interface control layer may be formed between the dielectric layer 206 and the top electrode 207. The interface control layer may also be formed between the bottom electrodes 205 and the dielectric layer 206. The interface control layer or layers may include titanium oxide ($TiO_2$) or tantalum oxide ($Ta_2O_5$).

The top electrode 207 may include a carbon-containing material 207C. The carbon-containing material 207C may include carbon and a silicon-containing material. The carbon-containing material 207C may be formed of silicon carbide (SiC). The carbon-containing material 207C may completely fill the space between the bottom electrodes 205. The top electrode 207 may further include a metal liner 207L. The metal liner 207L may include titanium nitride. The metal liner 207L may be formed between the carbon-containing material 207C and the dielectric layer 206. The metal liner 207L may be conformally formed on the dielectric layer 206. The metal liner 207L may be in direct contact with the dielectric layer 206, and a carbon-containing material 207C may be formed on the metal liner 207L.

Referring to FIG. 3B, the semiconductor device 220 may include a semiconductor substrate 201, a plurality of storage node contact plugs 203 spaced apart from one another over the semiconductor substrate 201, and a capacitor structure 211 over the storage node contact plugs 203. The capacitor structure 211 may include a plurality of bottom electrodes 205, a dielectric layer 206, and a top electrode 207. Each of the bottom electrodes 205 may electrically contact a respective one of the storage node contact plugs 203 by penetrating through the etch stop layer 204. A plurality of bottom electrodes 205, for example, at least two bottom electrodes 205, may be supported by each supporter 208. The bottom electrodes 205 may have a pillar shape.

The top electrode 207 may include a first top electrode 207C and a second top electrode 207R. The first top electrode 207C may be made of a gap fill material filling the space between the bottom electrodes 205. The first top electrode 207C may be made of a carbon-containing material. The first top electrode 207C may include carbon and a silicon-containing material. The first top electrode 207C may be made of silicon carbide (SIC). The second top electrode 207R may be made of a metal-containing material.

The top electrode 207 may be a stack of the first top electrode 207C and the second top electrode 207R, and the first top electrode 207C may completely fill the space between the bottom electrodes 205 without voids.

Referring to FIG. 3C, a semiconductor device 230 may include a semiconductor substrate 201, a plurality of storage node contact plugs 203 spaced apart from one another over the semiconductor substrate 201, and a capacitor structure 212 over the storage node contact plugs 203. The capacitor structure 212 may include a plurality of bottom electrodes 205, a dielectric layer 206, and a top electrode 207. Each of the bottom electrodes 205 may electrically contact a respective one of the storage node contact plugs 203 by penetrating through the etch stop layer 204. A plurality of bottom electrodes 205 may be supported by a supporter 208. The bottom electrodes 205 may have a pillar shape.

The top electrode 207 may include a first top electrode 207C, a second top electrode 207G, and a third top electrode 207R. The first top electrode 207C and the second top electrode 207G may be formed of a gap fill material filling the space between the bottom electrodes 205. The first top electrode 207C may be made of a carbon-containing material. The first top electrode 207C may include carbon and a silicon-containing material. The first top electrode 207C may be made of silicon carbide (SiC). The second top electrode 207G may be made of a germanium-containing material. The second top electrode 207G may be made of silicon germanium (SiGe). The third top electrode 207R may lower the resistance of the top electrode 207. The third top electrode 207R may include a metal, a metal nitride, a conductive metal nitride, or any combination thereof. The third top electrode 207R may include titanium (Ti), titanium nitride (TIN), tantalum nitride (TaN), tungsten (W), tungsten nitride (WN), ruthenium, iridium, ruthenium oxide, iridium oxide, or any combination thereof.

The top electrode 207 may be a stack of the first top electrode 207C, the second top electrode 207G, and the third top electrode 207R. The first top electrode 207C and the second top electrode 207G may completely fill the space between the bottom electrodes 205 without voids. The first top electrode 207C may formed conformally on the dielectric layer 206, and the second top electrode 207G completely fills the space between the bottom electrodes on the first top electrode 207C.

Referring to FIGS. 3A to 3C, the top electrode 207 of the capacitor structure 210 may have a double structure of titanium nitride and silicon carbide, the top electrode 207 of the capacitor structure 211 may have a double-layer structure of silicon carbide and silicon germanium, and the top electrode 207 of the capacitor structure 212 may have a triple-layer structure of silicon carbide, silicon germanium and metal.

According to another embodiment of the present invention, the top electrode 207 may include a stack of carbon and germanium-containing material and a germanium-containing material. For example, in an embodiment, the top electrode 207 may include a stack of Si—C—Ge and SiGe. The stack of Si—C—Ge and SiGe may refer to a stack of carbon-doped silicon germanium and carbon-undoped silicon germanium.

According to another embodiment of the present invention, the top electrode 207 may include an alloy of carbon and germanium. For example, the top electrode 207 may include Si—C—Ge.

In FIGS. 3B and 3C, the top electrode 207 may further include a metal liner (not shown). The metal liner may include titanium nitride. The metal liner may be formed between the first top electrode 207C and the dielectric layer 206. The metal liner may be conformally formed on the dielectric layer 206, and the first top electrode 207C may be formed on the metal liner.

FIGS. 4A to 4I are cross-sectional views illustrating a method for fabricating a semiconductor device in accordance with an embodiment of the present invention.

Figure 4A:
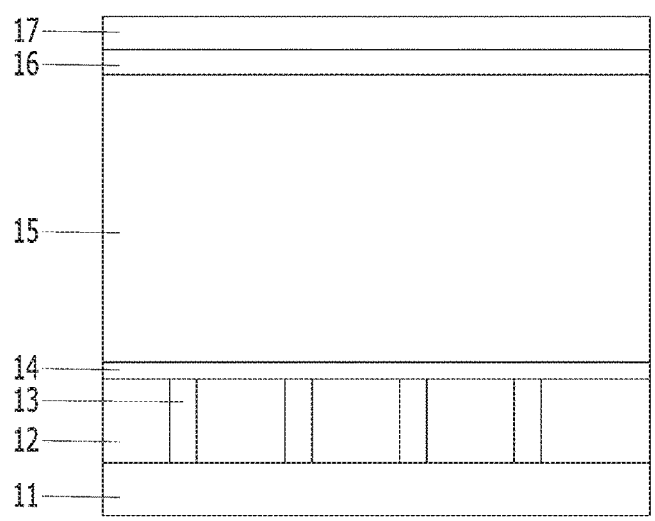
FIGS. 4A to 4I are cross-sectional views illustrating a method for fabricating a semiconductor device in accordance with an embodiment of the present invention.

Referring to FIG. 4A, an inter-layer dielectric layer 12 may be formed over a semiconductor substrate 11. Then, a plurality of storage node contact plugs 13 may be formed to penetrate through the inter-layer dielectric layer 12. The storage node contact plugs 13 may be arranged to be spaced apart from one another at regular intervals.

The storage node contact plugs 13 may be coupled to the semiconductor substrate 11 by penetrating through the inter-layer dielectric layer 12. The storage node contact plugs 13 may be made of any suitable material. For example, the storage node contact plugs 13 may be a silicon plug, a metal plug, or any combination thereof. Although not illustrated, buried word lines may be formed in the semiconductor substrate 11. A plurality of bit lines (not shown) may be further formed before the storage node contact plugs 13 are formed.

The semiconductor substrate 11 may be a material suitable for semiconductor processing. The semiconductor substrate 11 may be formed of a silicon-containing material. The semiconductor substrate 11 may include silicon, monocrystalline silicon, polysilicon, amorphous silicon, silicon germanium, monocrystalline silicon germanium, polycrystalline silicon germanium, carbon-doped silicon, combinations thereof, or multi-layers thereof. The semiconductor substrate 11 may include other semiconductor materials, such as germanium. The semiconductor substrate 11 may include a III/V-group semiconductor substrate, for example, a compound semiconductor substrate, such as GaAs. The semiconductor substrate 11 may include an SOI (Silicon On Insulator) substrate.

The inter-layer dielectric layer 12 may be formed of a HDP (high density plasma) oxide, a TEOS (TetraEthylOrthoSilicate), a PE-TEOS (Plasma Enhanced TEOS), an $O_3$-TEOS ($O_3$-Tetra Ethyl Ortho Silicate), a USG (Undoped Silicate Glass), a PSG (phosphosilicate glass), a BSG (borosilicate glass), a BPSG (borophosphosilicate glass), a FSG (fluoride silicate glass), a SOG (Spin On Glass), a TOSZ (Tonen SilaZene) or any combination thereof. Also, the inter-layer dielectric layer 12 may be formed of silicon nitride, silicon oxynitride, or a low-k dielectric material having a low dielectric constant.

A mold structure may be formed over the storage node contact plugs 13 and the inter-layer dielectric layer 12. The mold structure may include a stack of an etch stop layer 14, a first mold layer 15, a supporter layer 16, and a second mold layer 17.

The first mold layer 15 and the second mold layer 17 may be formed of, for example, silicon oxide ($SiO_2$). The first mold layer 15 may be formed to be thicker than the second mold layer 17. The first mold layer 15 and the second mold layer 17 may be formed by a deposition process, such as Chemical Vapor Deposition (CVD) or Physical Vapor Deposition (PVD).

The etch stop layer 14 may be formed of a material having an etch selectivity with respect to the inter-layer dielectric layer 12 and the first mold layer 15. The etch stop layer 14 may include silicon nitride or silicon oxynitride.

The supporter layer 16 may be formed of a material having etch selectivity with respect to the first mold layer 14 and the second mold layer 15. The supporter layer 16 may include silicon nitride or silicon carbon nitride (Si—C—N). The supporter layer 16 may be formed to be thinner than the first mold layer 15.

Figure 4B:
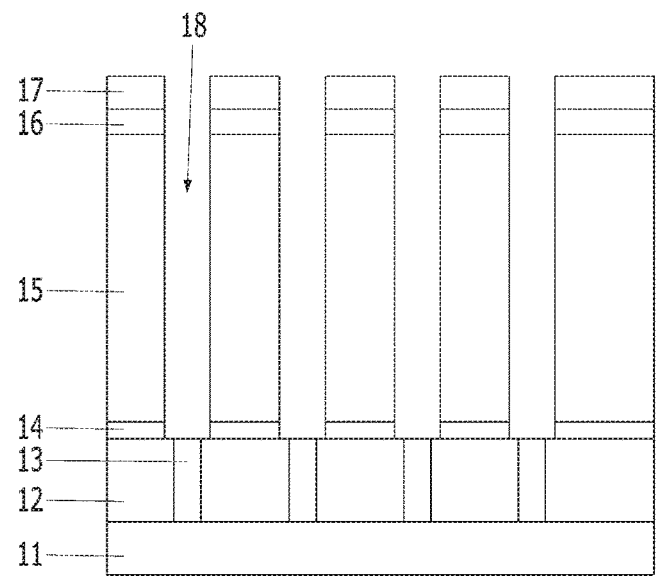

Referring to FIG. 4B, an opening 18 may be formed. The opening 18 may be formed by etching the mold structure by using a mask layer (not shown). To form the opening 18, the second mold layer 17, the supporter layer 16 and the first mold layer 15 may be sequentially etched by using the mask layer as an etch barrier. The etch process for forming the openings 18 may stop at the etch stop layer 14. Dry etching, wet etching, or a combination thereof may be used to form the openings 18. The openings 18 may be referred to as holes in which the bottom electrodes (or storage nodes) are to be formed. The openings 18 may have an aspect ratio of at least 1:1 or greater. For example, the openings 18 may have a high aspect ratio equal to or greater than 10:1. The aspect ratio as the term is used herein refers to the ratio of the height (H) to the width (W) of the openings 18.

Subsequently, the etch stop layer 14 may be etched to expose the top surface of the storage node contact plug 13 under each of the openings 18.

A mold structure pattern including a plurality of openings 18 may be formed by the series of etch processes described above. The mold structure pattern may be a stack of the etch stop layer 14, the first mold layer 15, the supporter layer 16, and the second mold layer 17.

Figure 4C:
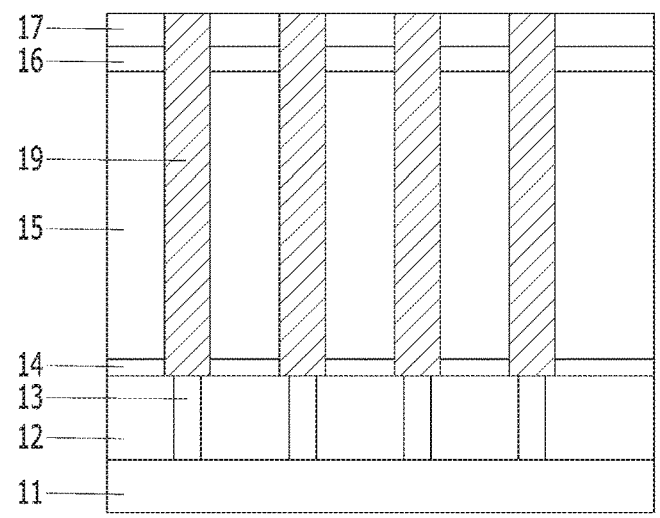

As illustrated in FIG. 4C, a bottom electrode 19 may be formed in each opening 18. The bottom electrodes 19 may fill the inside of corresponding openings 18. The bottom electrodes 19 may have a pillar shape. In order to form the pillar-shaped bottom electrodes 19, a planarization may be performed after depositing a conductive material so as to gap-fill the openings 18. The bottom electrodes 19 may include polysilicon, a metal, a metal nitride, a conductive metal oxide, a metal silicide, a noble metal, or any combination thereof. The bottom electrodes 19 may include at least one among titanium (Ti), titanium nitride (TiN), tantalum (Ta), tantalum nitride (TaN), titanium aluminum nitride (TiAlN), tungsten (W), tungsten nitride (WN), ruthenium (Ru), ruthenium oxide ($RuO_2$), iridium (Ir), iridium oxide ($IrO_2$), platinum (Pt), or any combination thereof. According to the embodiment of the present invention, the bottom electrodes 19 may include titanium nitride (TiN). The bottom electrodes 19 may include titanium nitride (ALD-TiN) which is formed by Atomic Layer Deposition (ALD).

According to another embodiment of the present invention, the bottom electrodes 19 may include a stacked structure of titanium nitride and tungsten. According to another embodiment of the present invention, the bottom electrodes 19 may include a stacked structure of titanium nitride and polysilicon.

Figure 4D:
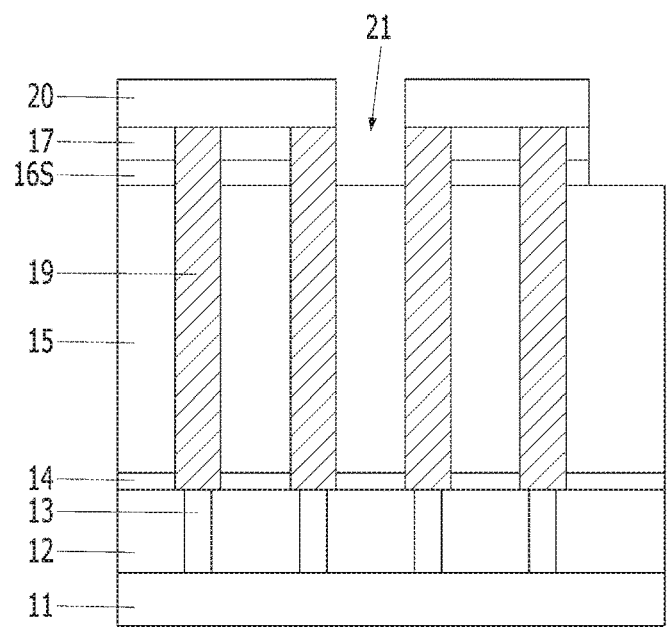

Referring to FIG. 4D, a supporter mask layer 20 may be formed. The supporter mask layer 20 may include photoresist or amorphous carbon. The supporter mask layer 20 may expose some surfaces of the second mold layer 17.

Subsequently, the second mold layer 17 and a part of the supporter layer 16 may be etched by using the supporter mask layer 20. The supporter opening 21 and the supporter 16S may be formed by etching the supporter layer 16.

The supporter 16S may contact the upper sidewalls of the bottom electrodes 19. Some surfaces of the first mold layer 15 may be exposed by the opening 21 and not being covered by the supporter 16S. The supporter 16S may have a shape of surrounding a portion of an outer sidewall of the bottom electrodes 19. The supporter 16S may prevent the bottom electrodes 19 having a high aspect ratio from collapsing in a subsequent process of removing the first and second mold layers 15 and 17. A plurality of supporters 16S may be formed at the same level, each one supporting the bottom electrodes 19.

Figure 4E:
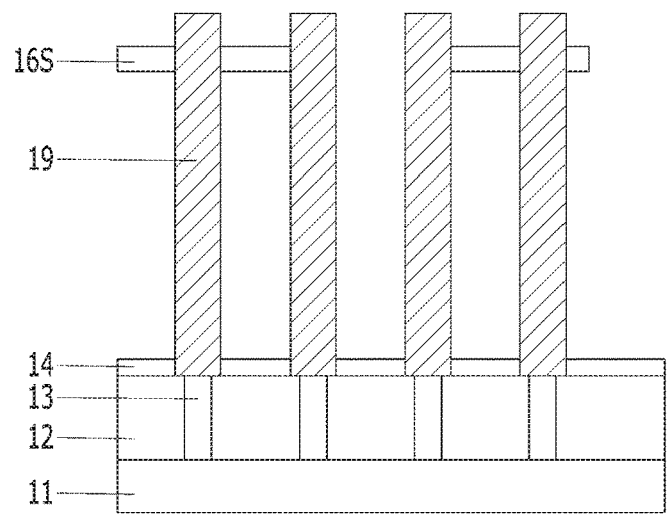

Referring to FIG. 4E, the supporter mask layer 20 may be removed. Subsequently, the second mold layer 17 and the first mold layer 15 may be removed. For example, the first and second mold layers 15 and 17 may be removed by a wet dip-out process. A wet chemical for removing the first and second mold layers 15 and 17 may be supplied through a supporter opening ('21' in FIG. 4D). As for the wet chemical, one or more chemicals among HF, $NH_4F/NH_4OH$, $H_2O_2$, HO, $HNO_3$, and $H_2SO_4$ may be used.

For example, when the first and second mold layers 15 and 17 are formed of silicon oxide, the first and second mold layers 15 and 17 may be formed by a wet dip-out process using a chemical containing hydrofluoric acid (HF). When the first and second mold layers 15 and 17 are removed, the supporter 16S having etch selectivity with respect to the first and second mold layers 15 and 17 may not be removed but remains in place. Thus, since the neighboring bottom electrodes 19 are supported by the supporter 16S, the bottom electrodes 19 may be prevented from collapsing.

When the first and second mold layers 15 and 17 are removed, the etch stop layer 14 may protect the storage node contact plugs 13 and the inter-layer dielectric layer 12 from being damaged.

Figure 4F:
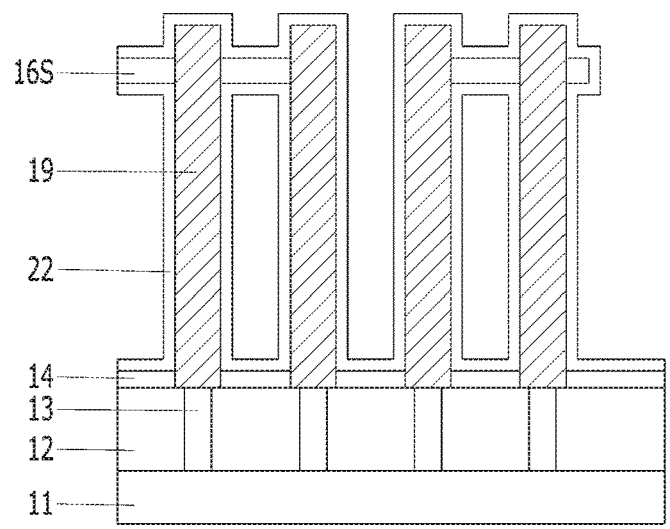

Referring to FIG. 4F, a dielectric layer 22 may be formed. A dielectric layer 22 may be formed over the bottom electrode 19 and the supporter 16S. A portion of the dielectric layer 22 may also cover the etch stop layer 14. The dielectric layer 22 may be made or include a high-k material having a higher dielectric constant than silicon oxide. The high-k material may include hafnium oxide ($HfO_2$), zirconium oxide ($ZrO_2$), aluminum oxide ($Al_2O_3$), titanium oxide ($TiO_2$), tantalum oxide ($Ta_2O_5$), niobium oxide ($Nb_2O_5$), or strontium titanium oxide ($SrTiO_3$). According to another embodiment of the present invention, the dielectric layer 22 may be formed of a composite layer including two or more layers of the aforementioned high-k material.

According to another embodiment of the present invention, the dielectric layer 22 may be formed of a zirconium oxide-based material having good leakage current characteristics while sufficiently reducing the equivalent oxide thickness (EOT). For example, the dielectric layer 22 may include ZAZ ($ZrO_2/Al_2O_3/ZrO_2$). According to another embodiment of the present invention, the dielectric layer 22 may include HAH ($HfO_2/Al_2O_3/HfO_2$).

According to yet another embodiment of the present invention, the dielectric layer 22 may include TZAZ ($TiO_2/ZrO_2/Al_2O_3/ZrO_2$), TZAZT ($TiO_2/ZrO_2/Al_2O_3/ZrO_2/TiO_2$), ZAZT ($ZrO_2/Al_2O_3/ZrO_2/TiO_2$), TZ ($TiO_2/ZrO_2$) or ZAZAT ($ZrO_2/Al_2O_3/ZrO_2/Al_2O_3/TiO_2$). In a dielectric layer stack such as TZAZ, TZAZT, ZAZT, TZ, and ZAZAT, $TiO_2$ may be replaced with $Ta_2O_5$.

The dielectric layer 22 may be formed by Chemical Vapor Deposition (CVD) or Atomic Layer Deposition (ALD) with excellent step coverage.

Figure 4G:
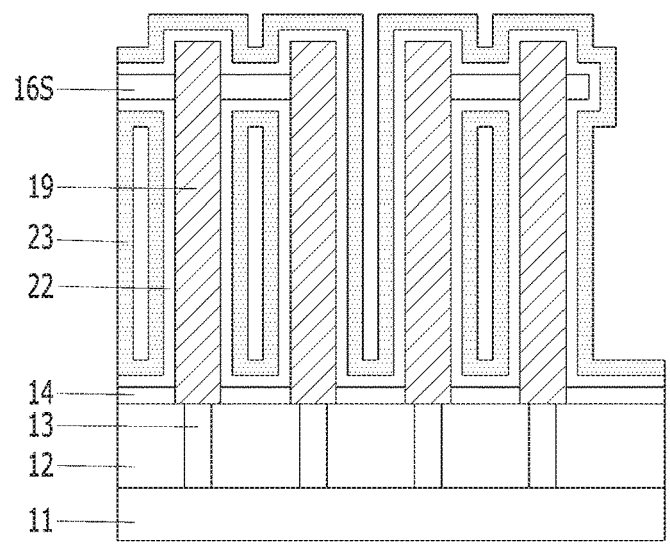

Referring to FIG. 4G, a first gap fill material 23 may be formed over the dielectric layer 22. The first gap fill material 23 may partially fill the space between the neighboring bottom electrodes 19. The first gap fill material 23 may be formed over the dielectric layer 22 to partially fill the space between the neighboring bottom electrodes 19. The first gap fill material 23 may not completely fill the space between the bottom electrodes 19. The first gap fill material 23 may include carbon and a silicon-containing material. The first gap fill material 23 may be a silicon carbide. In another embodiment, a metal liner may be formed on the dielectric layer 22 prior to forming the first gap fill material 23. The metal liner may include titanium nitride.

Figure 4H:
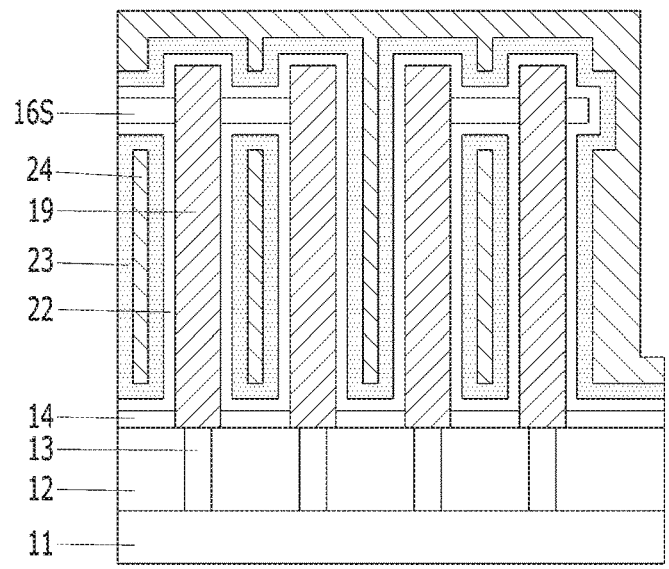

Referring to FIG. 4H, a second gap fill material 24 may be formed over the first gap fill material 23. The second gap fill material 24 may include a germanium-containing material. The second gap fill material 24 may be silicon germanium. The second gap fill material 24 may be boron-doped silicon germanium. The first gap fill material 23 and the second gap fill material 24 may fill the space between the bottom electrodes 19 without voids. Also, the first gap fill material 23 and the second gap fill material 24 may suppress the bottom electrodes 19 from bending.

Meanwhile, although not illustrated, a metal liner such as titanium nitride may be formed over the dielectric layer 22 before the first gap fill material 23 is formed. By forming the metal liner, the resistance of the top electrode may be further reduced.

Figure 4I:
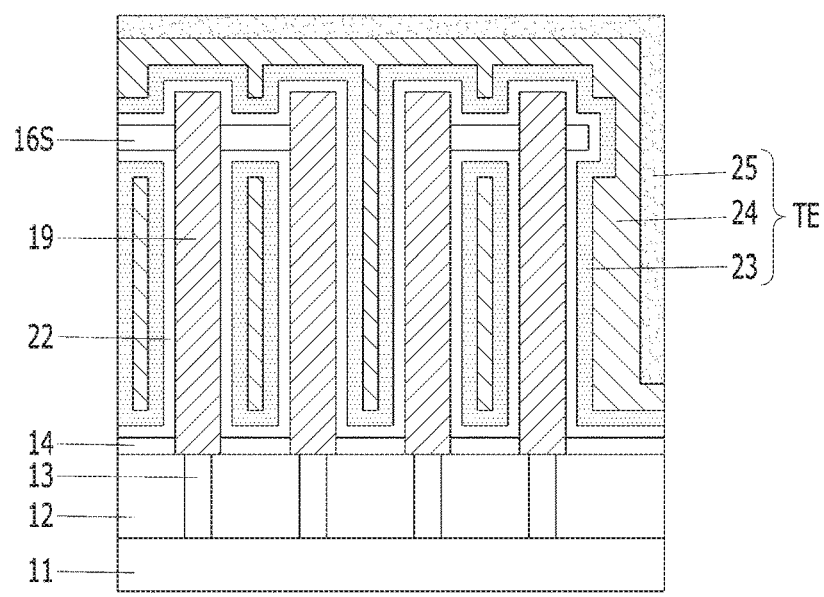

Referring to FIG. 4I, a metal-containing electrode 25 may be formed over the second gap fill material 24. The metal-containing electrode 25 may include a metal, a metal nitride, a conductive metal nitride, or any combination thereof. The metal-containing electrode 25 may include titanium (Ti), titanium nitride (TiN), tantalum nitride (TaN), tungsten (W), tungsten nitride (WN), ruthenium, iridium, ruthenium oxide, iridium oxide, or any combination thereof.

As described above, the first gap fill material 23, the second gap fill material 24, and the metal-containing electrode 25 may form the top electrode (TE) of the capacitor.

The metal-containing electrode 25 may lower the resistance of the top electrode (TE). The first and second gap fill material 23 and 24 may be gap fill materials that fill the space between the bottom electrodes 19. The first and second gap fill materials 23 and 24 may be gap fill the space between the bottom electrodes 19 without voids.

The first and second gap fill materials 23 and 24 and the metal-containing electrode 25 may be formed by Low Pressure Chemical Vapor Deposition (LPCD), Plasma Enhanced Chemical Vapor Deposition (PECVD), or Atomic Layer Deposition (ALD).

To take an example, the first gap fill material 23 may be silicon carbide, and the second gap fill material 24 may be silicon germanium, and the metal-containing electrode 25 may be tungsten nitride. Accordingly, the top electrode (TE) may be a stack of SiC/SiGe/WN.

According to another embodiment of the present invention, the supporter 165 may include at least one supporter 16S. For example, the supporter 165 may be made of a single level, a double level, a triple level, or a multi-layer level.

Figure 5:
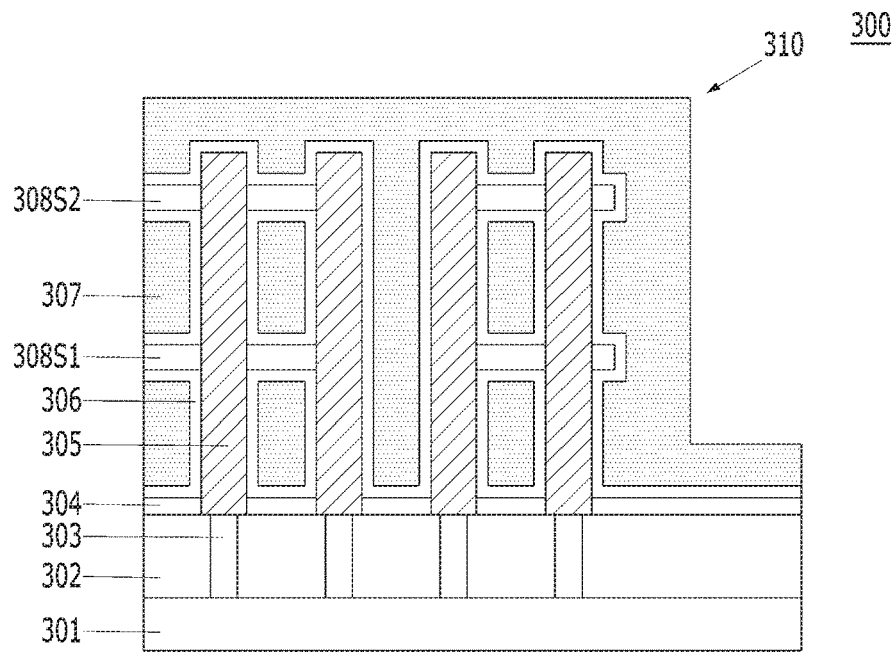
FIGS. 5 to 7 are cross-sectional views illustrating a semiconductor device in accordance with other embodiments of the present invention.
Figure 6:
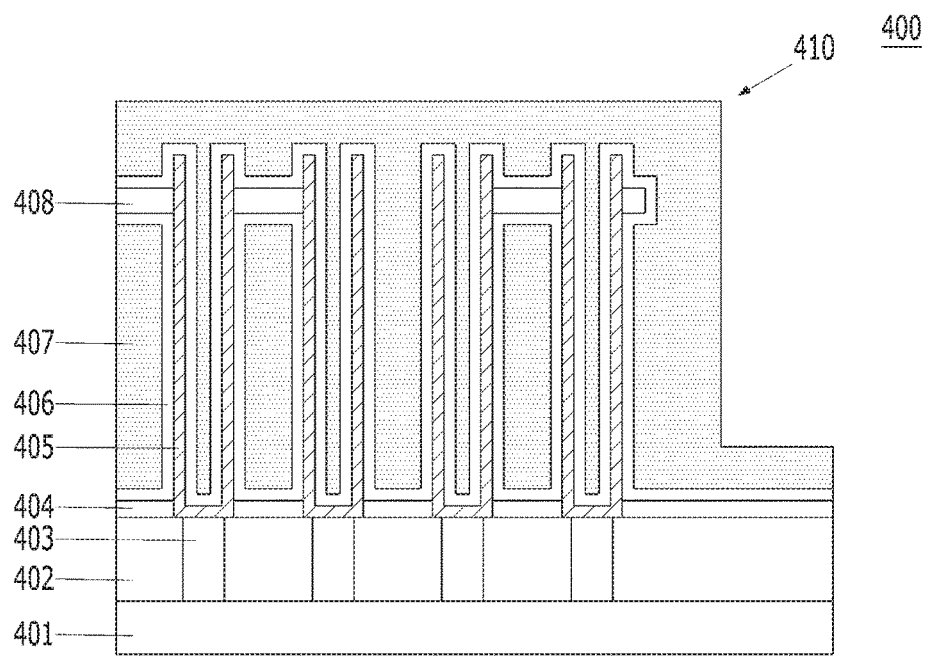
Figure 7:
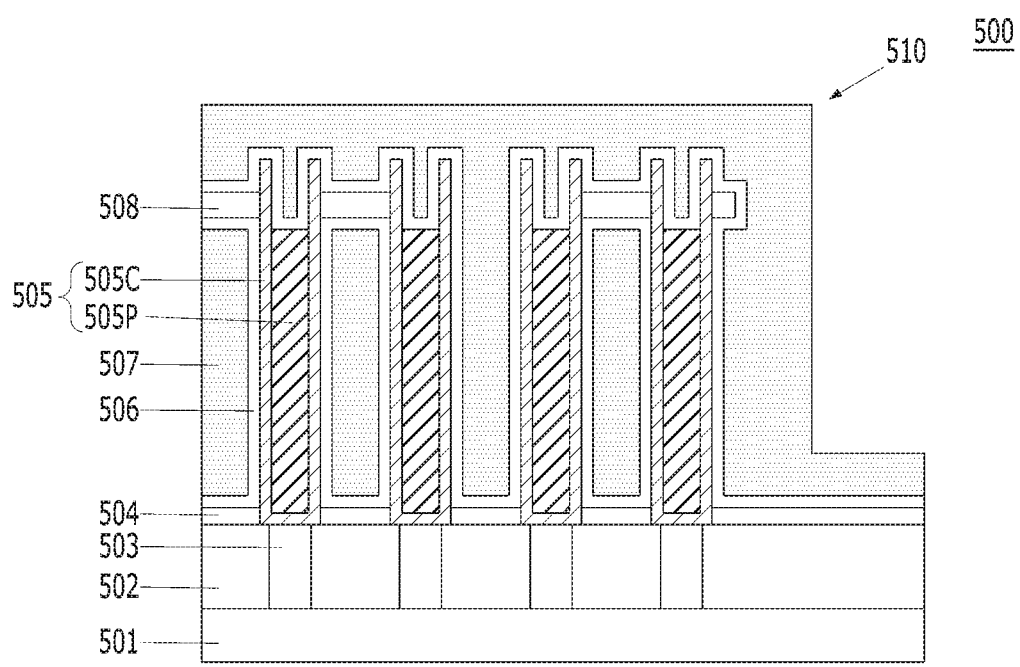

FIGS. 5 to 7 are cross-sectional views illustrating a semiconductor device in accordance with other embodiments of the present invention.

Referring to FIG. 5, a semiconductor device 300 may include a semiconductor substrate 301, storage node contact plugs 303 over the semiconductor substrate 301, and a capacitor structure 310 over the storage node contact plugs 303. The capacitor structure 310 may include a plurality of bottom electrodes 305, a dielectric layer 306, and a top electrode 307. The bottom electrodes 305 may each electrically contact a respective one of the storage node contact plugs 303 by extending through an etch stop layer 304. A plurality of bottom electrodes 305 may be supported by double supporters 30851 and 30852 which may be formed at different levels. The bottom electrodes 305 may have a pillar shape.

As for the top electrode 307, the above-described embodiments of the present invention may be referred to. For example, the top electrode 307 may include a carbon-containing material, such as a silicon carbide, a stack of SiC SiGe, a single structure of Si—C—Ge, and a stack of Si—C—Ge/SiGe. The top electrode 307 may further include a metal-containing material over a carbon-containing material.

Referring to FIG. 6, a semiconductor device 400 may include a semiconductor substrate 401, a storage node contact plug 403 over the semiconductor substrate 401, and a capacitor structure 410 over the storage node contact plug 403. The capacitor structure 410 may include a plurality of spaced apart cylindrical bottom electrodes 405, a dielectric layer 406, and a top electrode 407. The cylindrical bottom electrodes 405 may each electrically contact a respective one of the storage node contact plugs 403 by extending through an etch stop layer 404. A plurality of bottom electrodes 405 may be supported by at least one or more supporters 408.

The top electrode 407 will be described with reference to the above-described embodiments of the present invention. For example, the top electrode 407 may include a carbon-containing material, such as a silicon carbide, a stack of SiC/SiGe, a single structure of Si—C—Ge, and a stack of Si—C—Ge/SiGe. The top electrode 407 may further include a metal-containing material over a carbon-containing material.

Referring to FIG. 7, a semiconductor device 500 may include a semiconductor substrate 501, a plurality of storage node contact plugs 503 over the semiconductor substrate 501, and a capacitor structure 510 over the storage node contact plugs 503. The capacitor structure 510 may include bottom electrodes 505, a dielectric layer 506, and a top electrode 507. Each of the bottom electrodes 505 may have a composite shape of a pillar and a cylinder (which may be referred to as a pillynder shape, or pillyndrical). The bottom electrodes 505 may each electrically contact a respective one of the storage node contact plugs 503 by extending through an etch stop layer 504. The bottom electrodes 505 may be supported by at least one supporter 508.

The pillyndrical bottom electrodes 505 may each include a cylinder electrode 505C and a pillar electrode 505P. The pillar electrodes 505P may fully or partially fill the inside of the respective cylinder electrodes 505C. For example, the cylinder electrodes 505C may include titanium nitride, and the pillar electrodes 505P may include polysilicon.

As for the top electrode 507, the above-described embodiments of the present invention will be referred to. For example, the top electrode 507 may include a carbon-containing material, such as a silicon carbide, a stack of SiC/SiGe, a single structure of Si—C—Ge, a stack of Si—C—Ge/SiGe. The top electrode 507 may further include a metal-containing material over a carbon-containing material.

According to the embodiments of the present invention, a narrow gap between the bottom electrodes may be filled without voids by forming a top electrode to include a carbon-containing material.

Therefore, the characteristics and yield of the capacitor may be improved by reducing bending of the bottom electrodes.

While the present invention has been described with respect to specific embodiments, it will be apparent to those skilled in the art that various changes and modifications may be made without departing from the spirit and scope of the invention as defined in the following claims.

What is claimed is:

1. A capacitor, comprising:
a plurality of bottom electrodes;
a supporter for supporting outer walls of the bottom electrodes;
a dielectric layer formed over the bottom electrodes and the supporter; and
a top electrode formed over the dielectric layer,
wherein the top electrode includes:
a carbon-containing material formed on the dielectric layer; and
a germanium-containing material formed on the carbon-containing material and filling gaps between the bottom electrodes on the carbon-containing material,
wherein an upper surface of the supporter is disposed at a lower level than upper surfaces of the bottom electrodes.

2. The capacitor of claim 1, wherein the carbon-containing material includes silicon carbide.

3. The capacitor of claim 1, wherein the germanium-containing material includes silicon germanium.

4. The capacitor of claim 1, wherein the top electrode further includes a metal or metal-containing material over the germanium-containing material.

5. The capacitor of claim 1, wherein the supporter includes silicon nitride or silicon carbon nitride (Si—C—N).

6. The capacitor of claim 1, wherein the top electrode includes an alloy of the carbon-containing material and the germanium-containing material.

7. The capacitor of claim 1, wherein the top electrode includes a stack of the carbon-containing material and the germanium-containing material.

8. The capacitor of claim 1, wherein the carbon-containing material includes Si—C—Ge, and the germanium-containing material includes SiGe.

9. The capacitor of claim 1, wherein the germanium-containing material includes boron-doped silicon germanium.

10. The capacitor of claim 1, wherein each of the bottom electrodes has a pillar shape.

11. The capacitor of claim 1, wherein the dielectric layer includes a zirconium oxide-based material or a hafnium oxide-based material.

12. The capacitor of claim 1, wherein the carbon-containing material and the germanium-containing material completely fills the gaps between the bottom electrodes.

13. The capacitor of claim 1, wherein the carbon-containing material is formed conformally on the dielectric layer, and the germanium-containing material completely fills the gaps between the bottom electrodes on the carbon-containing material.

* * * * *